US009255974B2

(12) United States Patent
Dong et al.

(10) Patent No.: US 9,255,974 B2
(45) Date of Patent: Feb. 9, 2016

(54) METHOD FOR CHARACTERIZING AN ELECTRIC BATTERY (75) Inventors: Trung-Kien Dong, Hanoi (VN); Angel Zhivkov Kirchev, Aix les Bains (FR); Florence Mattera, St Egreve (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 865 days.

(21) Appl. No.: 13/387,022

(22) PCT Filed: Jul. 26, 2010

(86) PCT No.: PCT/EP2010/060809
§ 371 (c)(1),
(2), (4) Date: Jan. 25, 2012

(87) PCT Pub. No.: WO2011/012580
PCT Pub. Date: Feb. 3, 2011

(65) Prior Publication Data
US 2012/0130662 A1      May 24, 2012

(30) Foreign Application Priority Data

Jul. 28, 2009   (FR) .................................. 09 55286

(51) Int. Cl.
*G01R 31/36*   (2006.01)
*G06F 19/00*   (2011.01)

(52) U.S. Cl.
CPC .......... *G01R 31/3651* (2013.01); *G01R 31/362* (2013.01); *G06F 19/00* (2013.01)

(58) Field of Classification Search
CPC ... G01R 31/362; G01R 31/3651; G06F 19/00
USPC .......................................................... 702/63
See application file for complete search history.

(56) References Cited

U.S. PATENT DOCUMENTS

| | | | |
|---|---|---|---|
| 6,160,382 A | 12/2000 | Yoon et al. | |
| 6,208,147 B1 | 3/2001 | Yoon et al. | |
| 7,062,390 B2 | 6/2006 | Kim et al. | |
| 2002/0120906 A1 | 8/2002 | Xia et al. | |
| 2007/0035307 A1* | 2/2007 | Schoch | G01R 31/3651 324/426 |

(Continued)

FOREIGN PATENT DOCUMENTS

| | | |
|---|---|---|
| DE | 103 28 055 A1 | 8/2004 |
| DE | 10 2006 036 784 A1 | 2/2008 |

OTHER PUBLICATIONS

International Search Report and Written Opinion issued Aug. 30, 2010, in PCT/EP2010/060809 filed Jul. 26, 2010 with English translation of the International Search Report.

(Continued)

*Primary Examiner* — Regis Betsch
(74) *Attorney, Agent, or Firm* — Oblon, McClelland, Maier & Neustadt, L.L.P.

(57) ABSTRACT

A determination of particular parameters for modeling a battery such as a lithium-ion battery, for example the charge transfer resistance and the double layer behavior at the surface of electrical connections, by extrapolating results obtained in a stationary mode, for example without charge or discharge current, to quick charge or discharge modes, where traditional measurements are too slow, since the parameters vary as a function of the charge or discharge state.

12 Claims, 8 Drawing Sheets

(56) References Cited

U.S. PATENT DOCUMENTS

| | | | |
|---|---|---|---|
| 2007/0257681 A1* | 11/2007 | Christophersen et al. | 324/426 |
| 2008/0054848 A1* | 3/2008 | Yun | G01R 31/3662 320/134 |
| 2009/0096459 A1* | 4/2009 | Yoneda et al. | 324/430 |
| 2010/0066377 A1* | 3/2010 | Schoch | G01R 31/3651 324/427 |

OTHER PUBLICATIONS

Office Action mailed Sep. 1, 2015, in European Patent Application No. 10739554.3.

* cited by examiner

METHOD FOR CHARACTERIZING AN ELECTRIC BATTERY

The present invention relates to a method for characterizing an electric battery.

An electric battery can be represented by a model made up of simple elements (resistances, inductances, capacitors, or more generally, constant phase elements) that indicate the electrical and electrochemical properties of the battery and its electrical connections. Knowledge of this model makes it possible, among other things, to anticipate the evolution of the voltage at the terminals of the battery and the charge state of the battery as a function of time.

The elements of the modeling circuit are preponderant at different frequencies and can be characterized by impedance spectroscopy methods. The analysis must, however, be continued up to frequencies in the millihertz area, which requires long analysis times; however, the analysis requires a practically stationary state of the battery, which is not done when the spectroscopy must be done in the quick charge or discharge mode, since it is no longer possible to disregard the charge state variations between the beginning and end of the measurements over long periods and the parameters of the battery very with the charge state.

U.S. Pat. No. 6,160,382 A and U.S. Pat. No. 7,062,390 B2 belong to the technical field, a lithium-ion battery is described in "Effect of an additive to polysiloxane-based electrolyte on passive film formation on a graphite electrode," by Nakahara et al, Journal of Power Sources, 158 (2006), p. 600-607; and another in "Modeling battery behavior for accurate state-of-charge indication," by Pop et al, Journal of Electrochemical Society, 153 (11) (2006) p. A 2013-A 2022.

One primary object of the invention is therefore to improve the determination of the model of the battery, in particular for modes of the battery corresponding to significant charge and discharge currents. To summarize, it generally relates to a method for characterizing a battery provided with the electrical connections at its terminals, comprising modeling of said battery and determination of a resistance belonging to said model and corresponding to a charge transfer resistance at the surface of said electrodes for a specified mode and a specified state of the battery, the specified mode corresponding to the specified charge or discharge current of the battery and the specified state to a specified charge or discharge state of the battery for the specified mode, said determination comprising the preliminary steps of:
obtaining said resistance at an essentially stationary mode of the battery and a reference state corresponding to the specified state;
determining other resistances of the model; and
measuring a total potential difference at the terminals of the battery at the specified mode and at an intermediate state between a complete charge and a complete discharge of the battery,
characterized in that the determination also comprises the following steps:
obtaining said resistance at the essentially stationary mode and the intermediate state;
obtaining a residual potential difference corresponding to said resistance in the specified mode and in the intermediate state, subtracting from the total potential difference, potential differences created by said other resistances of the model and the specified current, in the specified mode and the intermediate state, as well as a potential difference measured at the terminals of the battery and in the absence of charge or discharge current; and
calculating said resistance by multiplying the residual potential difference by a ratio between the resistance in the corresponding state and the resistance in the intermediate state, and dividing it by the current.

Within the meaning of the invention, the quick charge or discharge modes are the operating modes of the battery that cause a non-negligible change in its charge state during the measurement of its parameters by spectroscopy over a range including low frequencies, and the essentially stationary modes are the others. The limits cannot be clearly set, but it may be situated around discharge currents of $C_N/5h$ or de $c_N/50h$ for example.

The invention will now be described in more detail using the figures, which will show all aspects of the invention.

Figure 1:
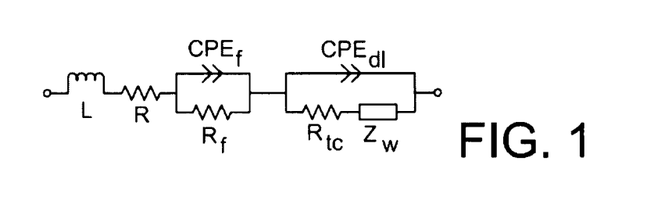
FIG. 1 shows an equivalent electrical circuit of a lithium-ion battery.
Figure 2:
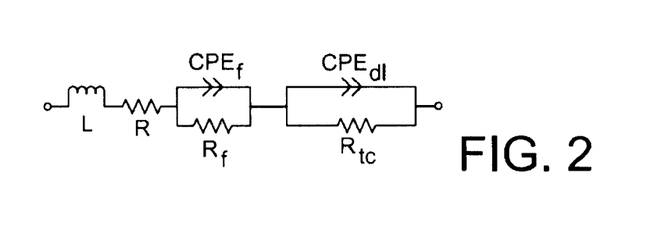
FIG. 2 shows an equivalent electrical circuit of that battery without considering a diffusion phenomenon.

The invention will be described relative to a lithium-ion battery, but it may of course apply to other types of batteries comprising a part accumulating the electrical energy and electrodes. FIG. 1 shows a model of the battery. L is the inductance of the electrical connections at the terminals of the battery, R is the sum of the internal resistance (of the accumulating parts) and the resistance of the electrical connections at the terminals of the battery. $R_f$ and $CPE_f$ in parallel represent the behavior of the passive layer on the surface of the anode, therefore comprising a resistive element and a constant phase element. $R_{tc}$ and $CPE_{dl}$ represent the charge transfer resistance and the double layer behavior on the surface of the electrodes; lastly, Zw is the diffusion impedance or the Warburg impedance. The latter is in fact often overlooked, and the model becomes according to FIG. 2.

Figure 3:
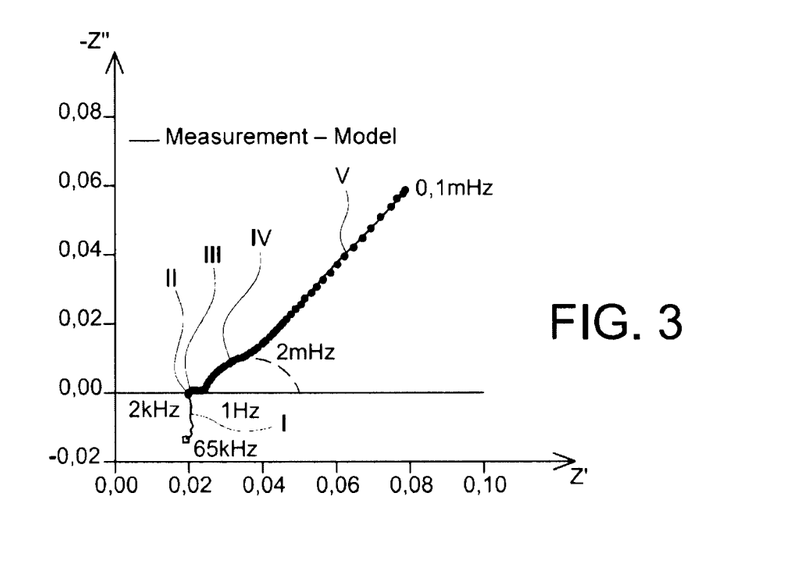
FIG. 3 shows an impedance spectroscopy result of the battery.

FIG. 3 shows a typical result of the measurement of the impedance of the battery in a spectroscopic analysis as a function of frequency; the real part of the impedance corresponds to the horizontal axis, and the imaginary part to the vertical axis.

The influence of the inductance L can be recognized in the lower part I of the graph, between 2 kHz and 65 kHz; this line is parallel to the imaginary axis. The resistance R corresponds to the point of intersection II between the graph and the real axis at about 2 kHz. The contribution of $R_f$ and $CPE_f$ corresponds to the portion III between 1 Hz and 2 kHz and corresponds to a small irregular semi-circle not far from the real axis. The contribution of $R_{tc}$ and $CPE_{dl}$ appears in the following portion IV between 1 Hz and 2 mHz, and corresponds to a curve approximately in a quarter circle larger than the previous one. The contribution of the diffusion impedance is lastly expressed at the very low frequencies, below 2 mHz, and corresponds to the portion V. The curve is obtained by spectroscopy, and the points by an adjustment of the parameters of the model, which demonstrates its validity through the quality of the correlation.

The diffusion impedance often being overlooked in the model, it may be necessary to apply the spectroscopy on the very low-frequency side up to approximately 2 mHz. The length of the measurement is approximately 40 min then. To avoid undergoing model parameter drifts as a function of the charge state of the battery, the measurements are then limited to essentially stationary states of the battery charge, with a slower charge and discharge mode than $C_N/50h$ where $C_N$ is the nominal charge of the battery expressed in ampere-hours or in the absence of charge or discharge current. Other methods already proposed, such as Fourier and Laplace transforms, make it possible to decrease the measuring time from 40 min to 500 s and 150 s respectively, which allows reliable measurements with quicker charge and discharge modes, but still limited to approximately $C_N/5h$.

On the one hand, the parameters L and R, $R_f$ and $CPE_f$ are characterized at high frequency. On the other hand, these parameters vary little with the charge state and battery current: they can therefore be considered constant. Their detection thus does not pose any difficulty at quick charge or discharge modes, with the result that here, one is interested in the determination of $R_{tc}$ and $CPE_{dl}$, the latter parameter itself being made up of parameters $T_{dl}$ and $P_{dl}$ according to the equation $$CPE = \frac{1}{T(j\omega)^P},$$

T being a pseudo-capacitor and P a deformation factor; the constant phase element CPE is a correct capacitor when P is close to 1. Lastly, it has been noted, through measurements between 2 mHz and 65 KHz in essentially stationary modes, that the determination factor $P_{dl}$ did not vary much as a function of the charge state and battery current. Furthermore, the hypothesis has been made that Pdl also does not vary at strong current. It is therefore the measurement $R_{tc}$, and secondarily that of $T_{dl}$, that are of interest here.

The following notations are introduced:

$$X^+(t) + X_0^+ + \frac{\int_0^t i\, d\tau}{3600 \times C_N} 100\%,$$

$$X^-(t) = 100\% - X^+(t).$$

$X^-(t)=100\%-X^+(t)$.

$X^+(t)$ and $X^-(t)$ are charge and discharge depth states of the battery, respectively, expressed in percentages. The charge states and discharge depths in reality apply to identical states of the battery, but which are respectively observed in a charge and discharge process thereof. $X_0^+$ is an initial charge state. i, expressed in amperes, is the battery current. t is the time, expressed in seconds. It will be recalled that $C_N$ is the nominal capacity of the battery expressed in ampere-hours. The total charge state ($X^+(t)=100\%$) is obtained by charging the battery in an essentially stationary mode (with a current of $C_N/10h$ for example) up to the maximum voltage, then continuing the charge at that voltage. The complete discharge state ($X^-(t)=100\%$) can be obtained by a discharge at the current of $C_N/10h$ as far as the minimum voltage.

A first step of the invention consists of bringing the battery to a charge (or discharge) state determined starting from the maximum charge state (or the maximum discharge state) as explained above. After a sufficient rest, the voltage is then measured at the terminals of the battery in an open circuit to approximately determine the equilibrium potential as a function of the charge state or, depending on the case, as a function of the discharge state, also called discharge depth. The values of $R_{tc}$ and $T_{dl}$ are obtained at a zero battery (or essentially static) current, as a function of the charge or discharge state, like the values of the other parameters $L_r$, $R_f$, $T_f$ and $P_{dl}$.

Figure 4:
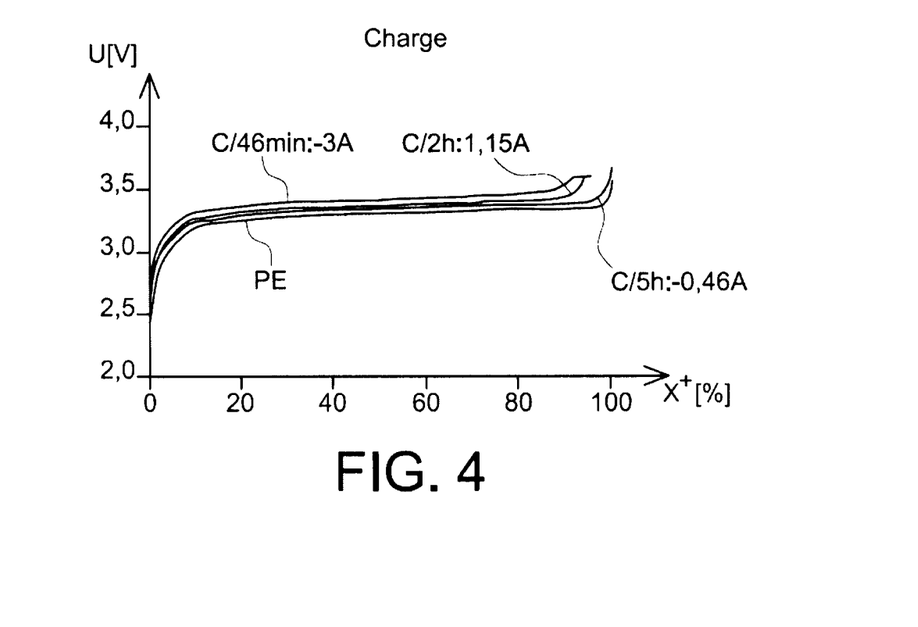
FIGS. 4 and 5 show voltages measured at the terminals of the battery in various quick charge or discharge modes.
Figure 5:
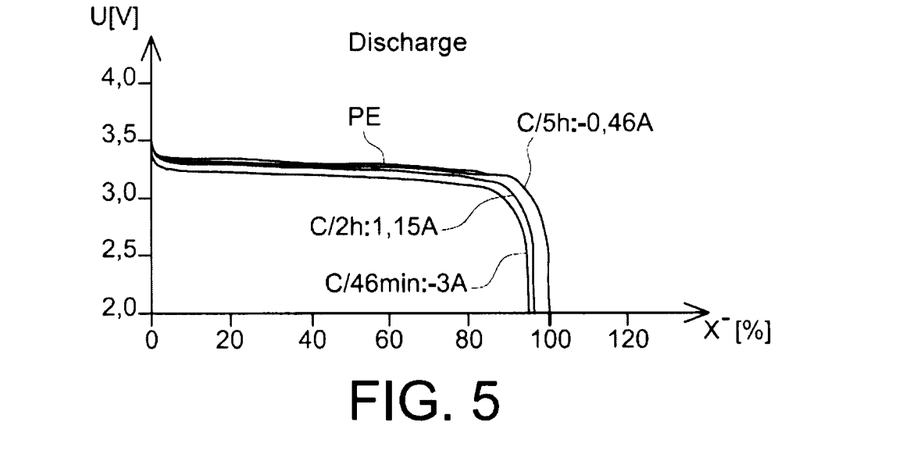

The voltage curves as a function of the discharge states are also obtained for the quick charge or discharge modes that are of interest here, with currents of C/5h, C/2h, C/46 min for example. The curves of FIG. 4 and FIG. 5 are then obtained.

The following relationship:

$$U_{dl}^I[X_I^+(X_I^-)]=U^I[X_I^+(X_I^-)]-PE[X_I^+(X_I^-)]-(R+R_f)I$$

then applies.

The notation $X_I^+(X_I^-)$ means that the relationship is valid indifferently in a charge or discharge process. The term in $U_{dl}^I$ designates the double layer overvoltage, in the charge state $X_I^+$ or at the discharge depth $X_I^-$. $U^I$ is the voltage at the terminals of the battery in the same charge state, applying the current I; $PE[X_I^+(X_I^-)]$ is the equilibrium potential of the battery in the same charge and discharge state; in reality it corresponds to the value measured during the test, in essentially stationary or essentially zero current modes; the term $(R+R_f)I$ can be calculated easily, since the resistances have been determined by impedance spectroscopy, and I is chosen by the user.

The parameter $R_{tc}^I$ for the charge or discharge current mode I, in charge state $X_I^+$ or at discharge depth $X_I^-$, can then be determined by the following relationship:

$$R_{tc}^I[X_I^+(X_I^-)] = \frac{U_{dl}^I[50\%(50\%)]}{I} \frac{R_{tc}^0[X_0^+(X_0^-)]}{R_{tc}^0[50\%(50\%)]}.$$

$U_{dl}^I$, expressed in volts, is the double layer overvoltage in charge or discharge mode with current I, calculated using the preceding equation, here at a charge state or discharge depth of 50%; other intermediate values between complete charge and complete discharge would be allowable, the curves of FIGS. 4 and 5 showing this voltage is constant over a wide range. $R_{tc}^0$ in the denominator is the value of $R_{tc}$ in the essentially stationary mode and at the same 50% charge or discharge state. $R_{tc}^0$ in the numerator is the value of $R_{tc}$ in an essentially stationary mode and a charge state (or discharge depth) $X_0^+$ or $X_0^-$ corresponding to state $X_I^-$ or $X_I^-$ of $R_{tc}^I$.

The correspondence between the states $X_0^+$ and $X_I^+$ depends on the following relationship:

$$X_I^+(X_I^-) = \frac{X_{max+}^I(X_{max-}^I)}{100\%} X_0^+(X_0^-).$$

It is in fact considered that the states of the essentially stationary mode and the quick charge or discharge mode put in correspondence must not be in exactly the same charge state or the same discharge depth, since FIGS. 4 and 5 show a stop of the discharge or discharge before 100% when it is produced with a non-negligible current. The value of $X_{max+}^I$ or $X_{max-}^I$ is the maximum charge or discharge value obtained at current I. Lastly, the expression $(T_{dl}{}^1[X_I^+(X_I^-)]=T_{dl}{}^0[X_0^+(X_0^-)])$ can be used to determine $T_{dl}$ as a function of the charge or discharge state in quick mode.

The preceding calculations have been considered for a single charge or discharge state; in practice, curves will rather be calculated corresponding to the entire extent of the charge or discharge, therefore involving the calculation of a large number of points in different charge or discharge states.

Figure 6:
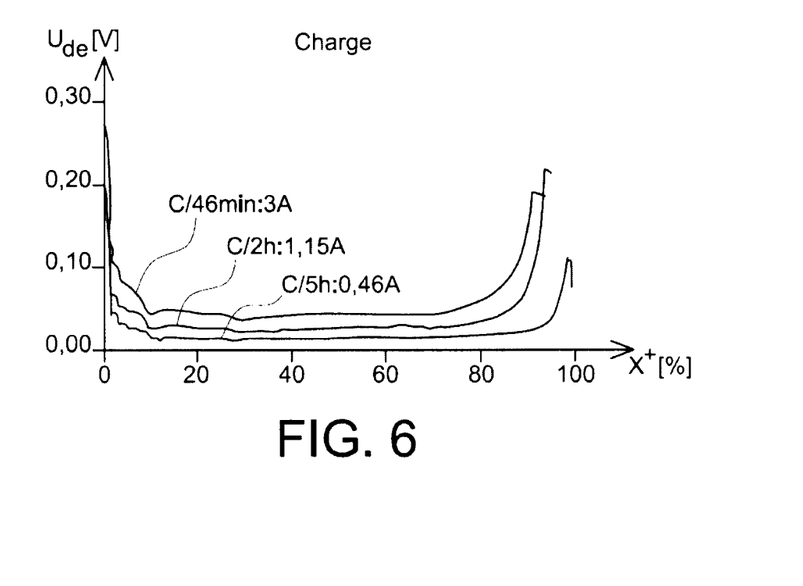
FIGS. 6 and 7 show over voltages of the double layer of electrodes in the same quick charge and discharge modes.
Figure 7:
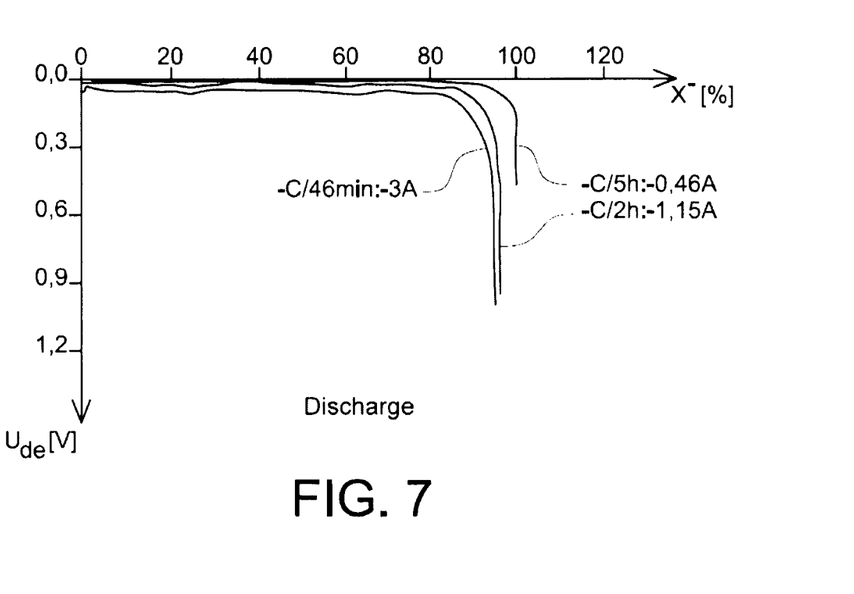
Figure 8:
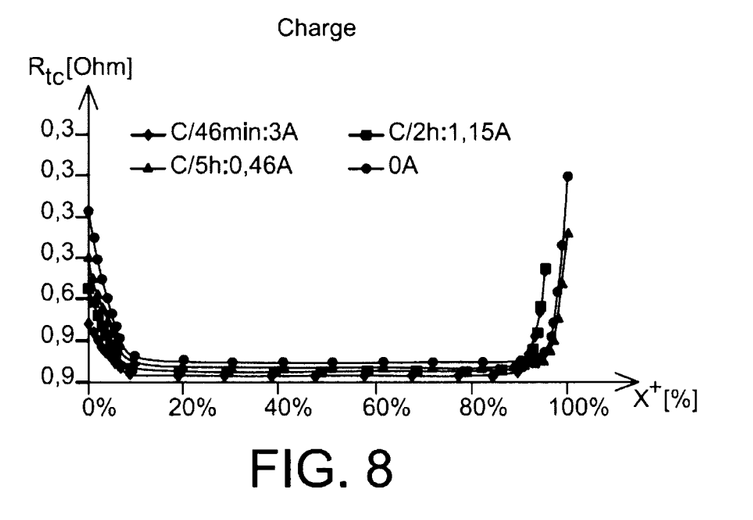
FIGS. 8, 9, 10 and 11 show the curves of the variables $R_{tc}$ and $T_{dl}$ calculated according to the invention in said quick charge or quick discharge modes.
Figure 9:
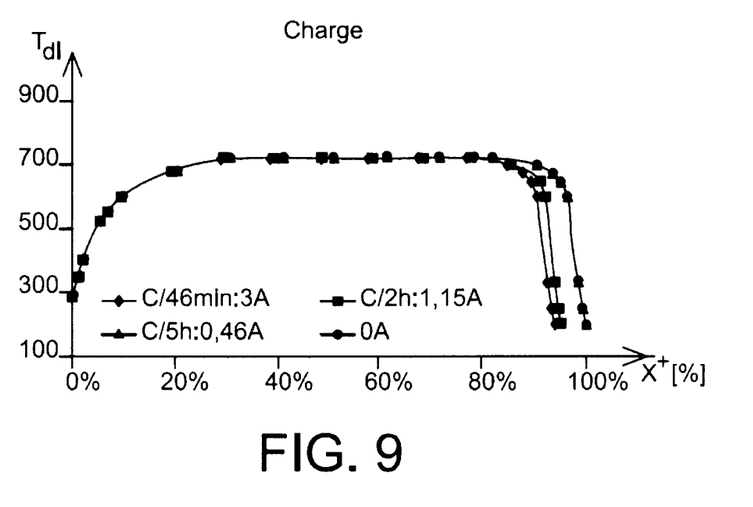
Figure 10:
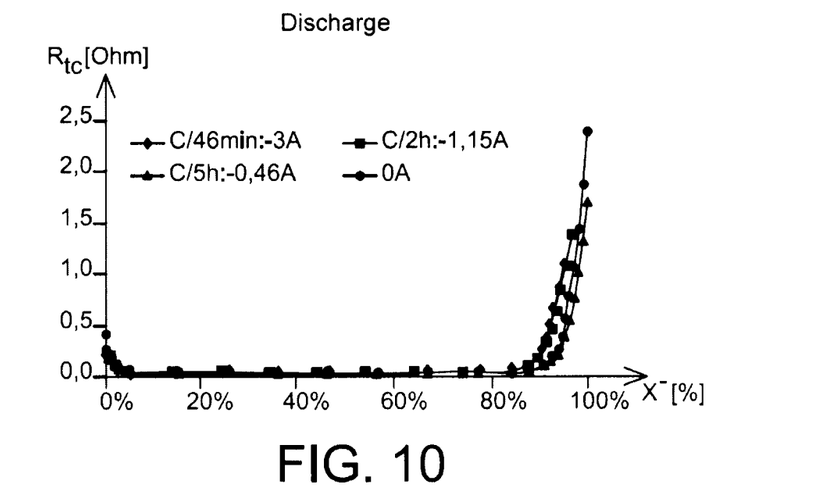
Figure 11:
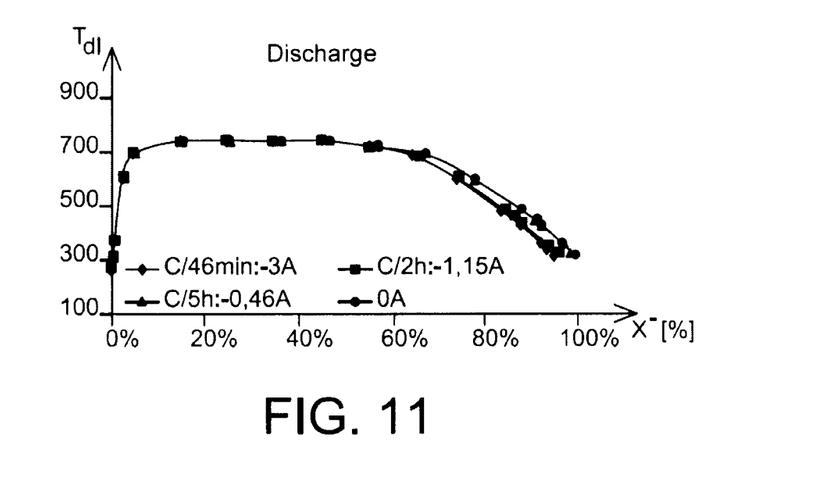

FIGS. 6 and 7 correspond to measurements of $U_{dl}{}^1$ in charge and discharge; FIGS. 8 and 9 correspond to charge curves of $R_{tc}$ and $T_{dl}$; FIGS. 10 and 11 correspond to the same curves in discharge.

One important step of the method is therefore a transformation by two geometrical similarities, between charge or discharge state variables $(X^+,X^-)$ according to the maximum states reached at different currents, and between functions of those variables $(R_{tc}, T_{dl})$ according to respective charge or discharge mode parameters. Tables 1 and 2 provide examples of an effective numerical resolution.

TABLE 1

| I | $R_{tc}{}^0[50\%]$ | $U_{dl}{}^1[50\%]$ | $X_{max+}{}^1$ |
|---|---|---|---|
| 1.15 | 0.045 | 0.0286 | 92.14 |

| $X_0^+$ | $R_{tc}{}^0[X_0^+]$ | $T_{dl}{}^0[X_0^+]$ | $X_1^+$ | $R_{tc}{}^1[X_1^+]$ | $T_{dl}{}^1[X_1^+]$ |
|---|---|---|---|---|---|
| 7 | 0.108 | 550 | 6.45 | 0.0598 | 550 |
| 51 | 0.045 | 720 | 47.04 | 0.0249 | 720 |
| 95 | 0.069 | 644 | 87.53 | 0.0383 | 644 |

TABLE 2

| I | $R_{tc}{}^0[50\%]$ | $U_{dl}{}^1[50\%]$ | $X_{max+}{}^1$ |
|---|---|---|---|
| −1.15 | 0.040 | 0.0267 | 96.26 |

| $X_0^-$ | $R_{tc}{}^0[X_0^-]$ | $T_{dl}{}^0[X_0^-]$ | $X_1^-$ | $R_{tc}{}^1[X_1^-]$ | $T_{dl}{}^1[X_1^-]$ |
|---|---|---|---|---|---|
| 5 | 0.0465 | 700 | 4.81 | 0.0270 | 700 |
| 67 | 0.0450 | 687 | 64.53 | 0.0261 | 687 |
| 97 | 1.0895 | 450 | 87.60 | 0.0788 | 450 |

Figure 12:
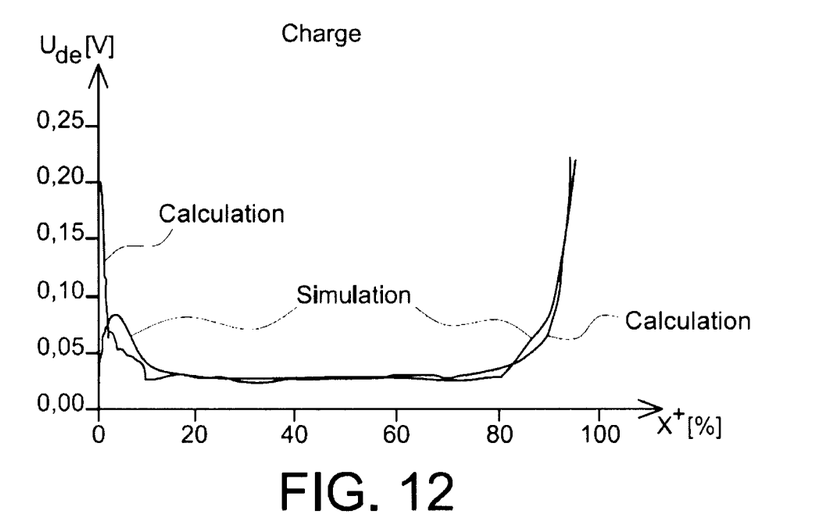
FIGS. 12 and 13 show comparisons between the double layer overvoltage calculated and obtained by simulation using the electrical circuit of FIG. 2.
Figure 13:
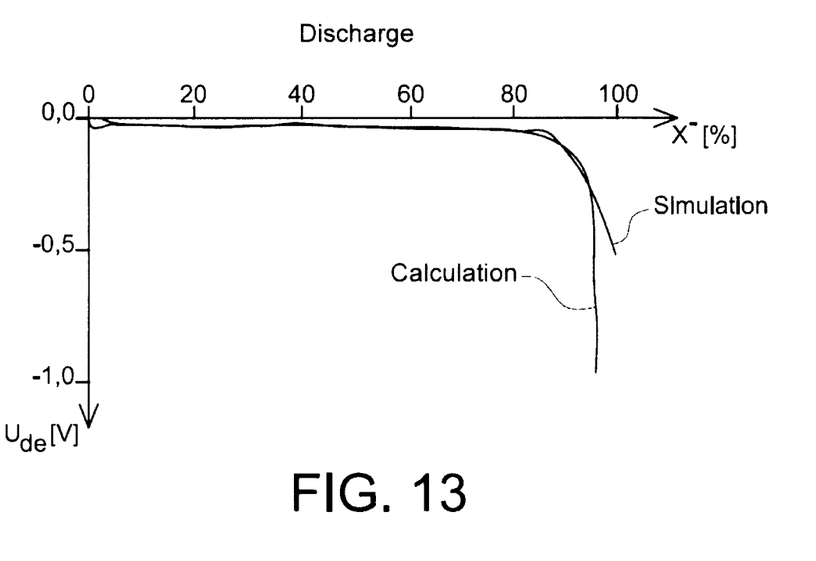
Figure 14:
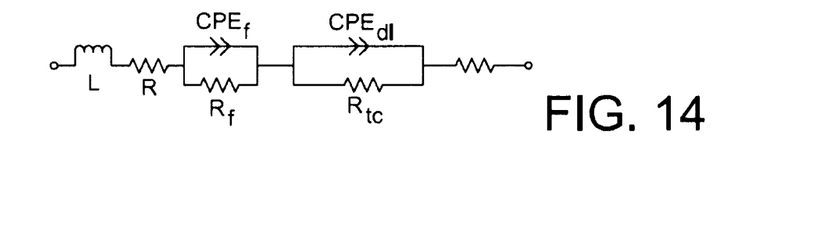
FIG. 14 shows an improved equivalent electrical circuit to model the battery.
Figure 15:
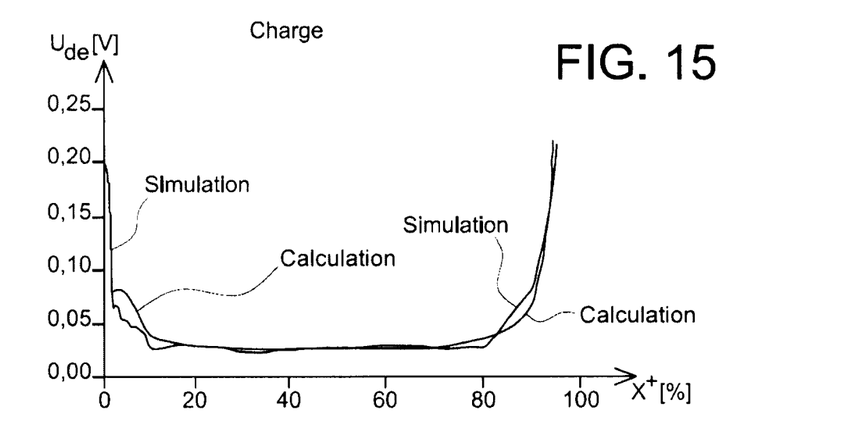
FIGS. 15 and 16 show a comparison between the calculated double layer overvoltage and the simulation in the charge or discharge mode by using the circuit of FIG. 14.
Figure 16:
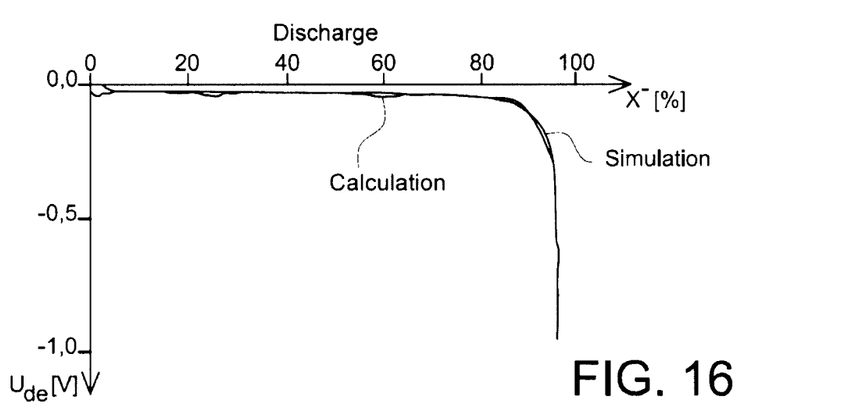

The following part of this description relates to a comparison between the double layer overvoltages $U_{dl}{}^1$ respectively obtained using simulation via the model of FIG. 1 (after having calculated $R_{tc}{}^1$ and $T_{dl}{}^1$ according to the preceding) and a calculation via the relationship shown above as a function of $U^1$, PE and $(R+R_f)I$, from measurements. FIGS. 12 and 13 show the respective curves in the case of a charge and a discharge. One can see a noticeable concordance flaw at the beginning of the charge or the end of the discharge, where the overvoltage obtained by calculation has a nearly vertical variation. This phenomenon can be modeled by the provisional appearance of a resistance during the short time. It is therefore proposed to complete the model of FIG. 1 or 2 with an additional resistance according to FIG. 14. A perfect concordance is then obtained in these extreme states, as expressed by FIGS. 15 and 16.

Figure 17:
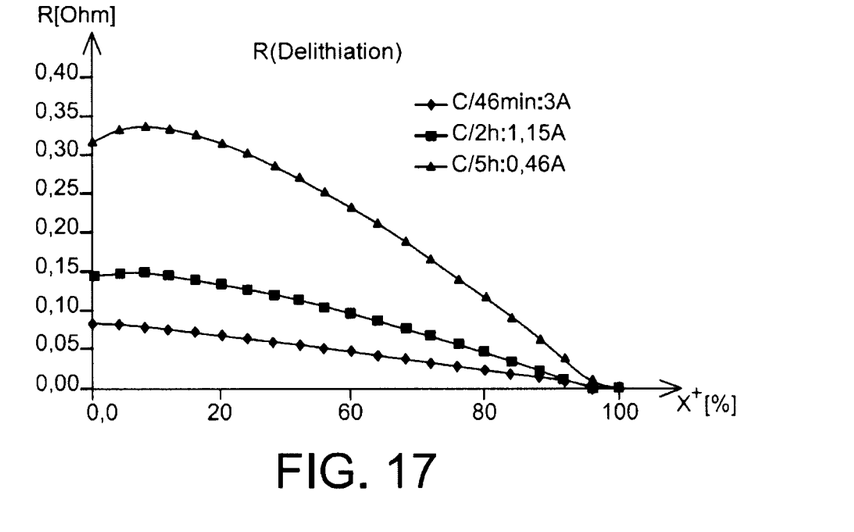
FIGS. 17 and 18 show the values of the additional resistance calculated in the quick charge modes.
Figure 18:
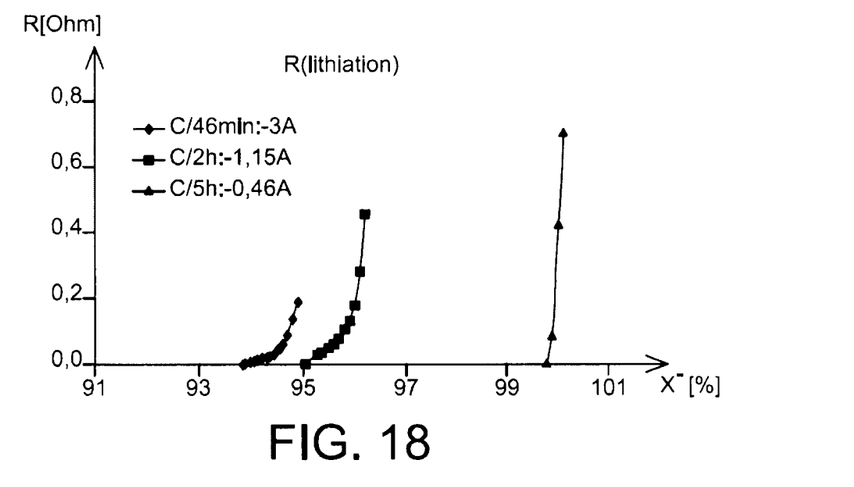

This resistance could relate to the beginning of a deintercalation of the $Li^+$ ions of the material of the cathode at the beginning of the charge and the end of the intercalation of the $Li^+$ ions at the material of the cathode at the end of the discharge, in the case of the lithium ion battery. This resistance can be calculated approximately using the following equation $$R_{(de)lithiation} = \frac{U_{cal}^1[X_I^+(X_I^-)] - U_{sim}^1[X_I^+(X_I^-)]}{I},$$

where $U_{cal}{}^1$ cal $U_{sim}{}^1$ are the voltages calculated and simulated for $U_{dl}$ (according to the mentioned methods) at the terminals of the battery in the charge state considered for a charge or discharge current I. If $X_I^+ \geq 2\%$, 0 will be attributed the value of that resistance in the case of charge; in the case of the discharge, that value 0 will be attributed if $X_I^- \leq X_{max}{}^1 - 0.5\%$. Graphs providing the value of this resistance as a result are provided in FIGS. 17 and 18 seen.

Tests have yielded a nearly perfect concordance with the above model, both for charges and discharges at a constant intensity (the comparisons then pertained to voltage curves as a function of the charge or discharge state) as well as charge or discharge at a constant voltage (the comparisons then pertained to charge or discharge intensity curves as a function of the charge or discharge state), therefore more complex processes with variable intensity or voltage able to comprise charge or discharge alternatives. The errors were 2% at worst, and much lower in most cases.

The invention claimed is:

1. A method for characterizing a battery including electrodes, which include an anode and a cathode, at its terminals, comprising:
   acquiring a model of the battery which includes, in series, at least (i) an inductance L of the electrical connections at the terminals of the battery, (ii) a resistance R which is the sum of the internal resistance of accumulating parts and the resistance of the electrical connections at the terminals of the battery, (iii) a resistive element $R_f$ in parallel with constant phase element $CPE_f$ which represent a behavior of a passive layer on a surface of an anode of the battery, (iv) a charge transfer resistance $R_{tc}$ in parallel with a double layer behavior $CPE_{dl}$ on the surface of the electrodes of the battery; and
   determination of the charge transfer resistance $R_{tc}$ belonging to the model for a specified mode and a specified state of the battery, the specified mode corresponding to a specified charge or discharge current of the battery and the specified state to a specified charge or discharge state of the battery for the specified mode,
   the determination comprising:
   performing impedance spectography on the battery and obtaining the inductance L, the resistance R, the resistive element $R_f$ and the constant phase element $CPE_f$;
   either bringing the battery to a charge state using the specified charge current and measuring the voltage at the terminals of the battery to obtain a charge state voltage curve, or bringing the battery to a discharge state using the specified discharge current and measuring the voltage at the terminals of the battery to obtain a discharge state voltage curve; and
   based on the results of the spectography and the obtained voltage curves,
      obtaining a charge transfer resistance at an essentially stationary mode of the battery and a reference state corresponding to the specified state;
      measuring a total potential difference at the terminals of the battery at the specified mode and at an intermediate state between a complete charge and a complete discharge of the battery;
      obtaining a charge transfer resistance at the essentially stationary mode and the intermediate state;

obtaining a residual potential difference corresponding to the charge transfer resistance in the specified mode and in the intermediate state, subtracting from the total potential difference, potential differences created by other resistances of the model and the specified charge or discharge current, in the specified mode and the intermediate state, as well as a potential difference measured at the terminals of the battery and in the absence of charge or discharge current; and calculating the charge transfer resistance $R_{tc}$ belonging to the model by multiplying the residual potential difference by a ratio between the charge transfer resistance in the corresponding state and the charge transfer resistance in the intermediate state, and dividing it by the current.

2. The method for characterizing a battery according to claim 1, wherein the intermediate state is at 50% of the complete charge or complete discharge of the battery.

3. The method for characterizing a battery according to claim 1, wherein the reference state and the specified state are in a charge ratio of the battery equal to a ratio between a maximum charge of the battery obtained in the essentially stationary mode and a maximum charge obtained in the specified mode, from complete discharge states.

4. The method for characterizing a battery according to claim 1, wherein the reference state and the specified state are in a charge ratio of the battery equal to a ratio between a maximum charge of the battery obtained in the essentially stationary mode and a maximum discharge obtained in the specified mode, from a complete charge state.

5. The method for characterizing a battery according to claim 1, further comprising an evaluation of an element of a constant phase model corresponding to a perfect or imperfect capacity on the surface of the electrodes in the specified state, owing to a measurement done in the essentially stationary mode and in the corresponding state, the element being assumed to be constant irrespective of the specified current.

6. The method for characterizing a battery according to claim 1, wherein the battery is a lithium-ion battery, and further comprising an incorporation into the model of a variable resistance as a function of the specified mode and the specified state, and non-zero only at beginning-of-charge and end-of-discharge states, close to a complete discharge state, the resistance then having a value equal to a difference between a double layer voltage obtained by calculation and a voltage obtained with a model of the battery provided without the resistance, divided by a current of the specified mode.

7. A method for characterizing a battery including electrodes, which include an anode and a cathode, at its terminals, comprising:
    acquiring a model of the battery; and
    determination of a charge transfer resistance $R_{tc}$ belonging to the model for a specified mode and a specified state of the battery, the specified mode corresponding to a specified charge or discharge current of the battery and the specified state to a specified charge or discharge state of the battery for the specified mode,
    the determination comprising:
    performing impedance spectography on the battery;
    either bringing the battery to a charge state using the specified charge current and measuring the voltage at the terminals of the battery to obtain a charge state voltage curve, or bringing the battery to a discharge state using the specified discharge current and measuring the voltage at the terminals of the battery to obtain a discharge state voltage curve; and
    based on the results of the spectography and the obtained voltage curves,
        obtaining a charge transfer resistance at an essentially stationary mode of the battery and a reference state corresponding to the specified state;
        measuring a total potential difference at the terminals of the battery at the specified mode and at an intermediate state between a complete charge and a complete discharge of the battery;
        obtaining a charge transfer resistance at the essentially stationary mode and the intermediate state;
        obtaining a residual potential difference corresponding to the charge transfer resistance in the specified mode and in the intermediate state, subtracting from the total potential difference potential differences created by other resistances of the model and the specified charge or discharge current, in the specified mode and the intermediate state, as well as a potential difference measured at the terminals of the battery and in the absence of charge or discharge current; and
        calculating the charge transfer resistance $R_{tc}$ belonging to the model by multiplying the residual potential difference by a ratio between the charge transfer resistance in the corresponding state and the charge transfer resistance in the intermediate state, and dividing it by the current.

8. The method for characterizing a battery according to claim 7, wherein the intermediate state is at 50% of the complete charge or complete discharge of the battery.

9. The method for characterizing a battery according to claim 7, wherein the reference state and the specified state are in a charge ratio of the battery equal to a ratio between a maximum charge of the battery obtained in the essentially stationary mode and a maximum charge obtained in the specified mode, from complete discharge states.

10. The method for characterizing a battery according to claim 7, wherein the reference state and the specified state are in a charge ratio of the battery equal to a ratio between a maximum charge of the battery obtained in the essentially stationary mode and a maximum discharge obtained in the specified mode, from a complete charge state.

11. The method for characterizing a battery according to claim 7, further comprising an evaluation of an element of a constant phase model corresponding to a perfect or imperfect capacity on the surface of the electrodes in the specified state, owing to a measurement done in the essentially stationary mode and in the corresponding state, the element being assumed to be constant irrespective of the specified current.

12. The method for characterizing a battery according to claim 7, wherein the battery is a lithium-ion battery, and further comprising an incorporation into the model of a variable resistance as a function of the specified mode and the specified state, and non-zero only at beginning-of-charge and end-of-discharge states, close to a complete discharge state, the resistance then having a value equal to a difference between a double layer voltage obtained by calculation and a voltage obtained with a model of the battery provided without the resistance, divided by a current of the specified mode.

* * * * *